(12) United States Patent
Chuo et al.

(10) Patent No.: US 8,242,374 B2
(45) Date of Patent: *Aug. 14, 2012

(54) FLEXIBLE-CIRCUIT-BOARD CABLE WITH POSITIONING STRUCTURE FOR INSERTION

(75) Inventors: Chih-Heng Chuo, Zhongli (TW); Kuo-Fu Su, Zhongli (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 308 days.

This patent is subject to a terminal disclaimer.

(21) Appl. No.: 12/588,288

(22) Filed: Oct. 9, 2009

(65) Prior Publication Data

US 2010/0326705 A1  Dec. 30, 2010

(30) Foreign Application Priority Data

Jun. 26, 2009  (TW) .............................. 98121721 A

(51) Int. Cl.
*H05K 1/00* (2006.01)
(52) U.S. Cl. .......... 174/254; 174/250; 174/255; 439/67; 439/77; 439/492
(58) Field of Classification Search .................. 439/67, 439/77, 329, 492, 495, 497; 174/254, 250, 174/255; 361/749–751
See application file for complete search history.

(56) References Cited

U.S. PATENT DOCUMENTS

| | | | | |
|---|---|---|---|---|
| 5,414,220 A * | 5/1995 | Hanato et al. | | 174/254 |
| 5,556,300 A * | 9/1996 | Parker | | 439/497 |
| 5,658,164 A * | 8/1997 | Parker | | 439/495 |
| 6,027,366 A * | 2/2000 | Mori et al. | | 439/495 |
| 6,315,616 B1 * | 11/2001 | Hayashi | | 439/638 |
| 6,910,914 B1 * | 6/2005 | Spink, Jr. | | 439/497 |
| 7,189,105 B2 * | 3/2007 | Takaku et al. | | 439/497 |

* cited by examiner

*Primary Examiner* — Angel R Estrada
*Assistant Examiner* — Dimary Lopez
(74) *Attorney, Agent, or Firm* — Rosenberg, Klein & Lee

(57) ABSTRACT

Provided is a flexible-circuit-board cable having a positioning structure. A connection zone is defined in a free end of the flexible-circuit-board cable and is provided with a plurality of conductive contacts. The connection zone has a first surface on which at least one projection section is formed and a second surface. A shielding layer overlaps the projection section and a portion of the first surface. The second surface of the connection zone is also bonded to a shielding layer. When the connection zone of the flexible-circuit-board cable is inserted into an insertion space defined in a connector, the first and second local zones of the connection zone formed by the shielding layers and the projection section are put into engagement with and thus positioned and retained by walls on opposite sides of the insertion space of the connector to thereby fix within the connector.

12 Claims, 5 Drawing Sheets

FLEXIBLE-CIRCUIT-BOARD CABLE WITH POSITIONING STRUCTURE FOR INSERTION

FIELD OF THE INVENTION

The present invention relates to a flat cable formed of a flexible circuit board, and in particular to a flexible-circuit-board cable having a positioning structure for insertion operation thereof.

BACKGROUND OF THE INVENTION

It is known that an electrical connector establishes electrical connection between electrical cables, circuit boards, and other electrical circuit components through physical engagement. The electrical connector finds wide applications in various electrical/electronic products, such as notebook computers and personal digital assistants (PDAs).

A regular electrical connector is often fixed to a circuit board through soldering so that connection terminals of the connector are set in electrical engagement with contacts of circuit layout on the circuit board to establish electrical connection therebetween. In some applications, the electrical connector may also play a role of retaining another circuit component, such as retaining a flexible-circuit-board cable. In this regard, an electrical connector interfaces between the flexible-circuit-board cable and a printed circuit board for transmission of electrical signals therebetween.

Further, currently, signal transmission conducted between a liquid crystal display device and a system main board is often performed with a signal transmission interface realized by low voltage differential signals that feature high speed, low power, and low electromagnetic radiation. An electrical connection applicable to this new type of interface can be directly coupled to a flexible-circuit-board cable to form an electrical connection device, through which a signal from a distal end can be transmitted to a proximal end circuit board to effect transmission of signals between two systems.

SUMMARY OF THE INVENTION

However, in the conventional structure of electrical connector, a hold-down cover having an undersurface that is generally planar. In an attempt to hold a flexible-circuit-board cable, the hold-down cover is put directly on the flexible-circuit-board cable to have terminals of the connector engaging contacts formed on the flexible-circuit-board cable for realizing electrical connection between the connector and the flexible-circuit-board cable. However, since the upper surface of the flexible-circuit-board cable and the undersurface of the hold-down cover of the connector are both planar, the resulting mating force therebetween is generally insufficient, and this affects the force that the connector applies to hold the flexible-circuit-board cable. Consequently, the flexible-circuit-board cable may easily get loosened and separated from the connector, leading to loss of stable electrical connection between the connector and the flexible-circuit-board cable and loss of signal transmission between systems. Although connectors that overcome such a problem are available in the market, yet they are complicated in structure and require a tedious manufacturing process.

On the other hand, a conventional flexible-circuit-board cable is formed by covering a plurality of substantially parallel conductors with insulation layers in such a way that ends of the conductors are exposed outside the insulation layers to serve as contacts for being put into engagement with conductive terminals of the connector to establish electrical connection therebetween. However, since the surfaces of the conductors of the flexible-circuit-board cable exhibit a planar configuration, which prevents the conductive terminals of the connector that are to be put in contact therewith from being correctly and securely positioned on the conductors. Again, this makes the flexible-circuit-board cable easily loosened and separated from the connector, and such separation disables transmission of signals.

Further, the conventional connector of this kind is not capable of effectively eliminating external electromagnetic interference. Consequently, signal transmission between systems often suffers noise interference, which adversely affects the quality of signals.

Thus, an objective of the present invention is to provide a flexible-circuit-board cable having a positioning structure for insertion operation so as to alleviate the problems of the conventional flexible-circuit-board cable being easily loosened and separated from a mated connector and being incapable of eliminating external electromagnetic interference.

The technical solution that the present invention adopts to overcome the above discussed problems is a flexible-circuit-board cable having a positioning structure. A connection zone is defined in a free end of the flexible-circuit-board cable and is provided with a plurality of conductive contacts. The connection zone has a first surface and a second surface. At least one projection section is formed on the first surface of the connection zone. The projection section is raised above a reference datum plane defined by the first surface of the connection zone by a predetermined height and extends on the reference datum plane in a direction toward a location adjacent to the conductive contacts of the connection zone. A shielding layer overlaps the projection section and a portion of the first surface. The second surface of the connection zone is also bonded to a substrate and an additional shielding layer overlaps the substrate and a portion of the second surface of the connection zone.

When the connection zone of the flexible-circuit-board cable is inserted into an insertion space defined in an electrical connector, first and second local zones of the connection zone formed by the shielding layers and the projection section are put into engagement with and thus positioned and retained by walls on opposite sides of the insertion space of the connector so as to fix the flexible-circuit-board cable having a positioning structure in accordance with the present invention within the connector.

In an other preferred embodiment of the present invention, at least one projection section is formed on the second surface of the connection zone and a shielding layer overlaps the projection section and a portion of the second surface of the connection zone so as to allow the flexible-circuit-board cable having a positioning structure in accordance with the present invention to be positioned and retained in electrical connectors of various forms.

With the technical solution adopted in the present invention, a flexible-circuit-board cable is provided with a connection zone on which a projection section of a predetermined height is formed. The connection zone has shielding layers, which together with the projection section, form first and second local zones that can be put into retained engagement with an electrical connector. Compared to a planar surface of the conventional flexible circuit board based flat cables, the present invention effectively alleviates the problem of insufficient mating force, which often leads to the flexible circuit board being easily loosened and separated from the connector and incapable of providing stable electrical connection and signal transmission between systems, whereby the present invention helps to avoid using connectors that have complicated structures and are manufactured with complicated processes for securely retaining the flexible circuit boards and eliminating increased costs.

Further, the flexible-circuit-board cable of the present invention comprises shielding layers that conduct external electromagnetic interference through an end of the flexible-circuit-board cable to a proximal end circuit board to provide excellent shielding effect and thus alleviate the problem of the conventional flexible-circuit-board cables that are incapable of effectively eliminating external electromagnetic interference that leads to noise in signal transmission between systems and affecting the quality of the signals transmitted.

Further, the flexible-circuit-board cable of the present invention can be formed by simply applying the generally known techniques of manufacturing of flexible circuit boards, so that the problems of the conventional devices as discussed above can be resolved without additional manufacturing costs.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1:
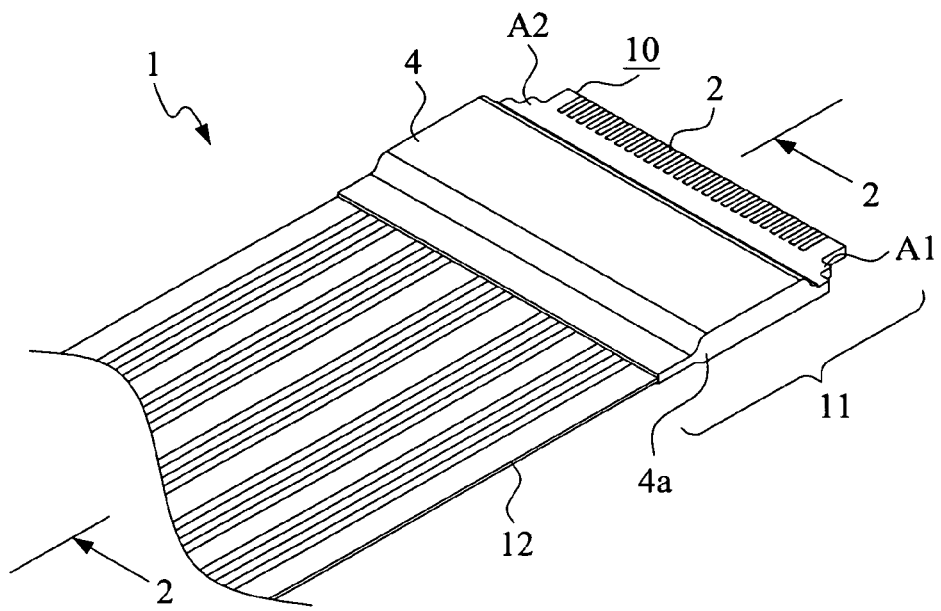
FIG. 1 is a perspective view of a first embodiment in accordance with the present invention.
Figure 2:
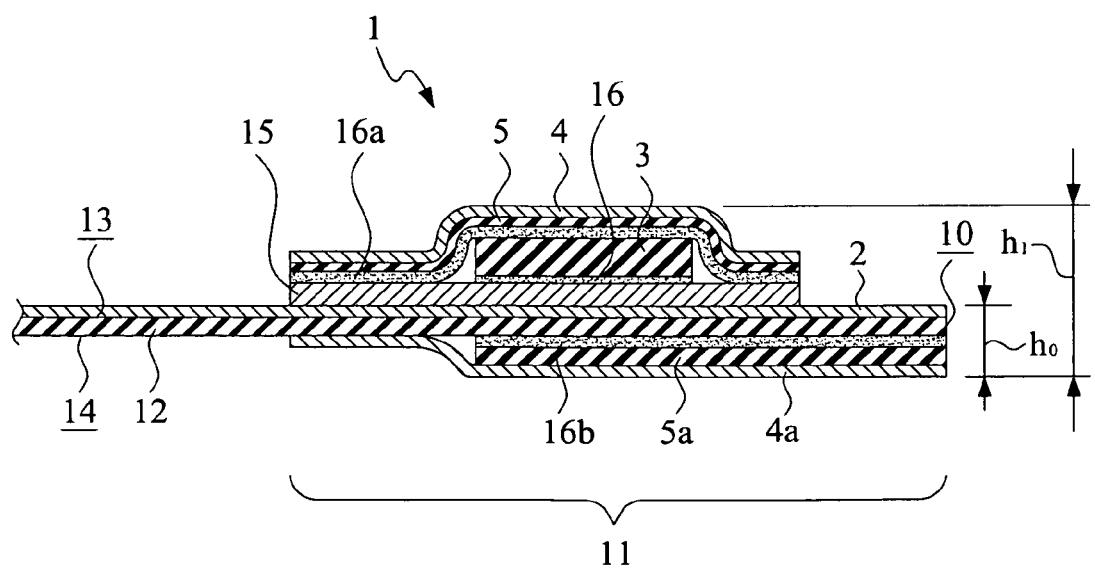
FIG. 2 is a cross-sectional view taken along line 2-2 of FIG. 1 that shows the first embodiment of the present invention.
Figure 3:
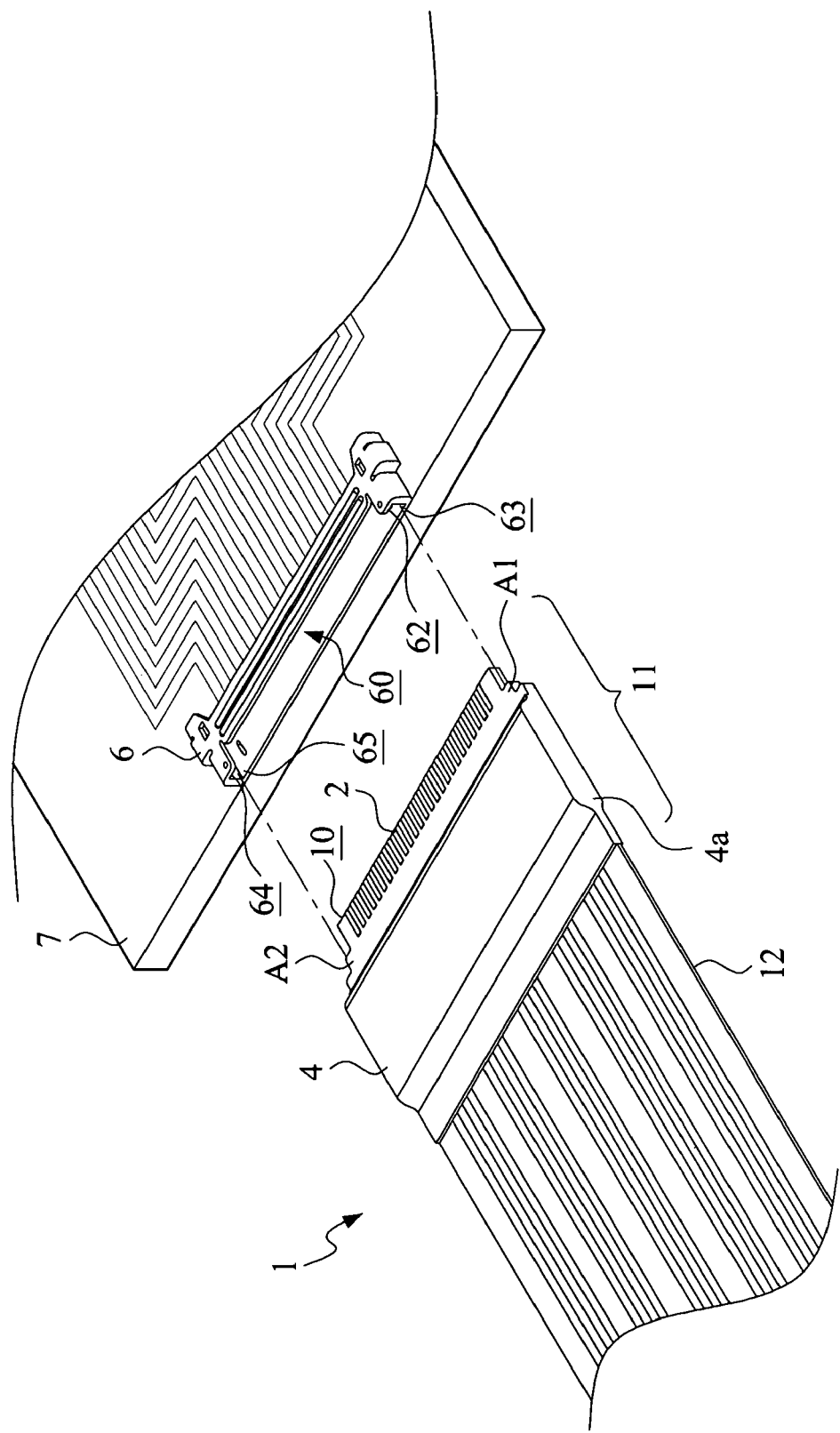
FIG. 3 is a perspective view of a flexible-circuit-board cable in accordance with a first embodiment of the present invention and an electrical connector that are shown in an unconnected condition.

With reference to the drawings and in particular to FIGS. 1 and 2, of which FIG. 1 shows a perspective view of a first embodiment in accordance with the present invention and FIG. 2 shows a cross-sectional view taken along line 2-2 of FIG. 1, the present invention provides a flexible-circuit-board cable 1 that has a positioning structure for insertion operation. The flexible-circuit-board cable 1 has a free end 10 that defines a connection zone 11. The flexible-circuit-board cable 1 comprises a flexible circuit substrate 12. The connection zone 11 is defined in the flexible circuit substrate 12 and has a first surface 13 and a second surface 14. The first surface 13 is provided thereon with a plurality of conductive contacts 2. The first surface 13 is further covered with an insulation layer 15. Bonded atop the insulation layer 15 with an adhesive layer 16 is at least one projection section 3.

As shown in the drawings, the projection section 3 is raised above a reference datum plane defined by the first surface 13 of the connection zone 11 by a predetermined height and extends on the reference datum plane in a direction toward a location adjacent to the conductive contacts 2 of the connection zone. A shielding layer 4 overlaps the projection section 3 and a portion of the first surface 13 of the connection zone 11. The shielding layer 4 has an undersurface forming a substrate 5 that is bonded to a surface of the projection section 3 by an adhesive layer 16a. The shielding layer 4 is made of an electrically conductive material, functioning to eliminate external electromagnetic interference.

According to the present invention, the second surface 14 of the connection zone 11 is bonded to a substrate 5a with an adhesive layer 16b, and the substrate 5a has an undersurface to which an additional shielding layer 4a is attached for overlapping the substrate 5a and a portion of the second surface 14 of the connection zone 11 to thereby construct the configuration shown in the drawings, in which the conductive contacts 2 of the flexible-circuit-board cable 1 provide a desired height h0 that allows for engagement with conductive terminals 61 of an electrical connector 6 and the flexible-circuit-board cable 1 also provides a height h1 that allows for retained engagement of the flexible-circuit-board cable 1 within the connector 6.

Figure 4:
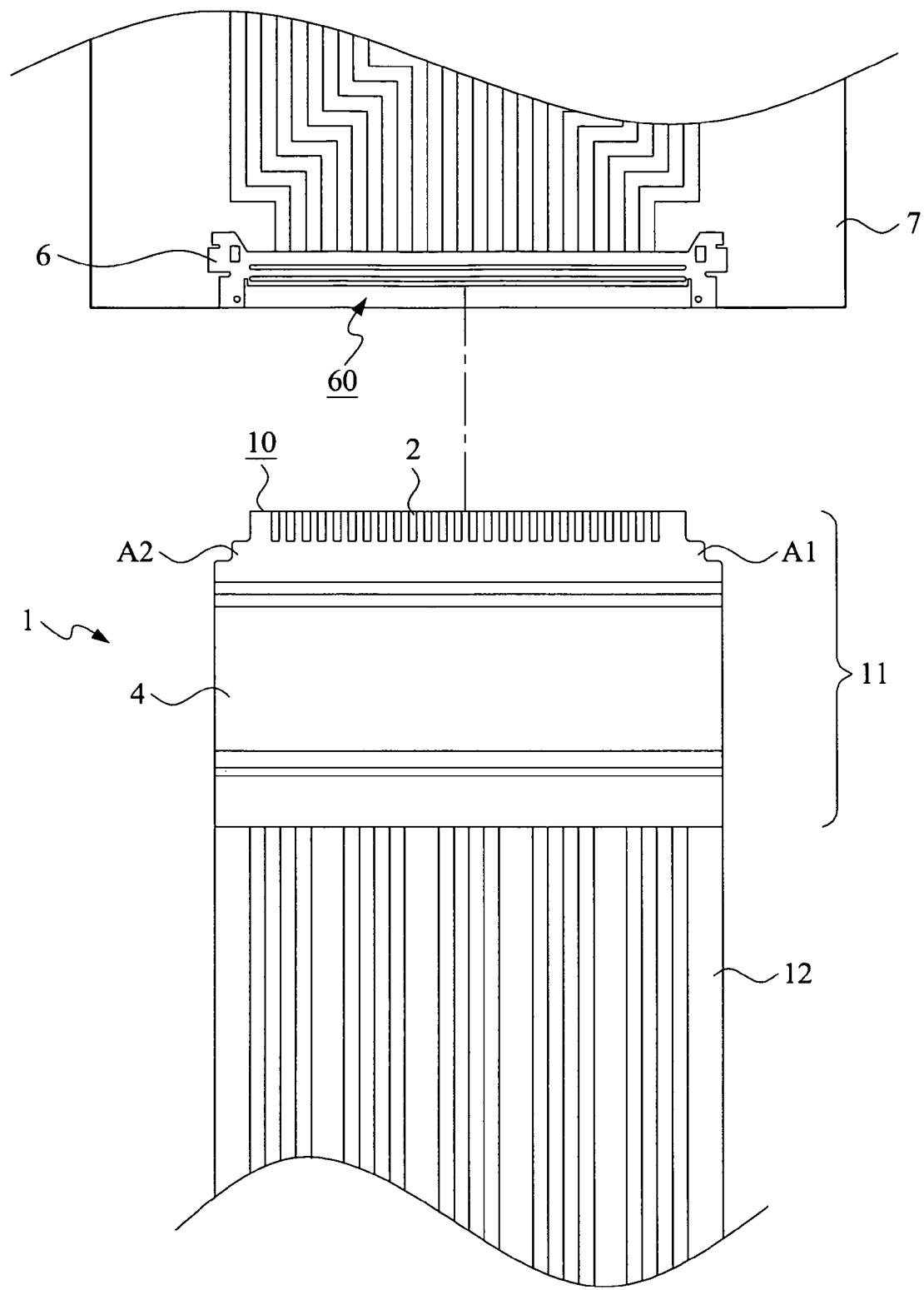
FIG. 4 is a top plan view of the flexible-circuit-board cable of the first embodiment of the present invention and the electrical connector in the unconnected condition.
Figure 5:
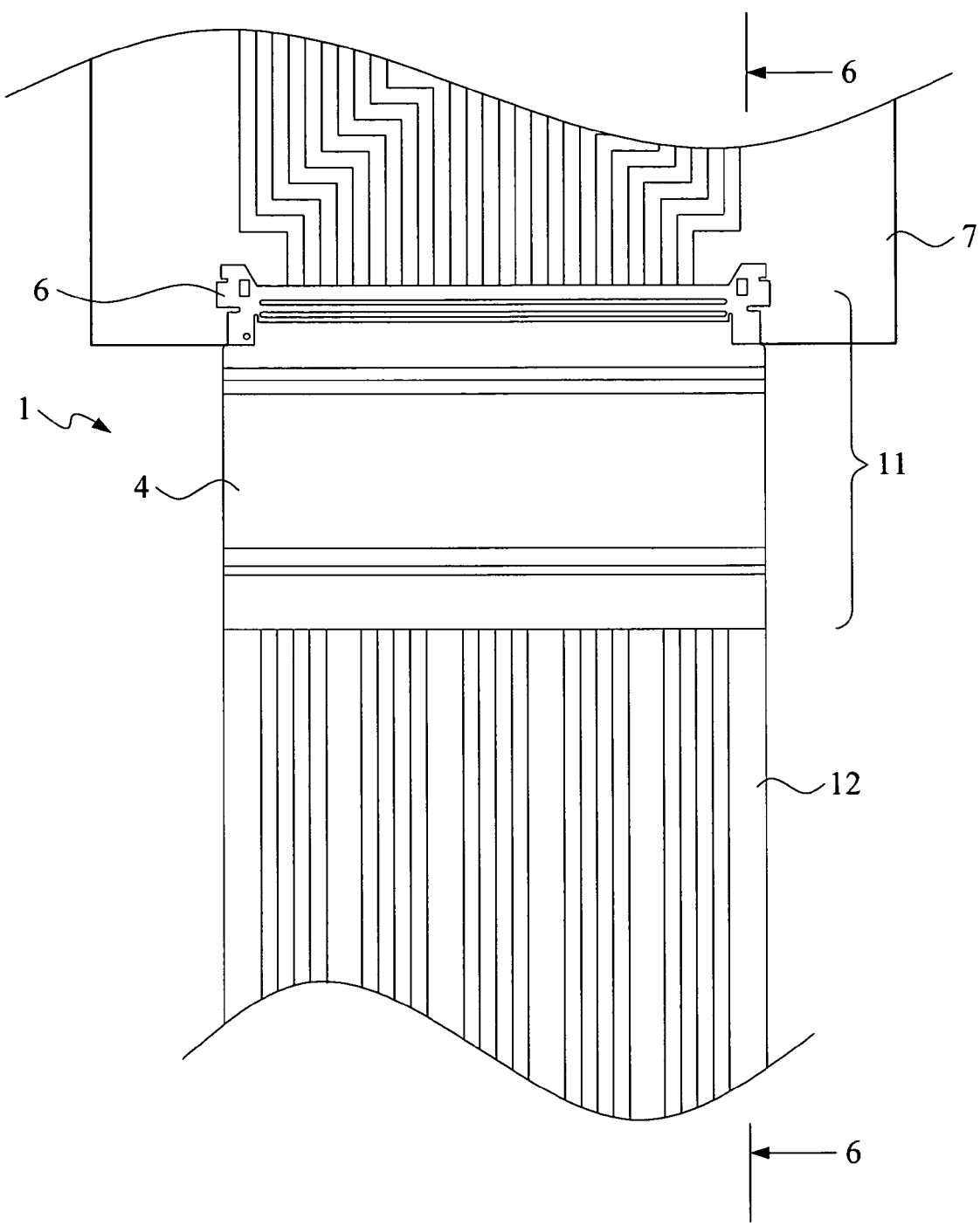
FIG. 5 is a top plan view of the flexible-circuit-board cable of the first embodiment of the present invention connected to the electrical connector.
Figure 6:
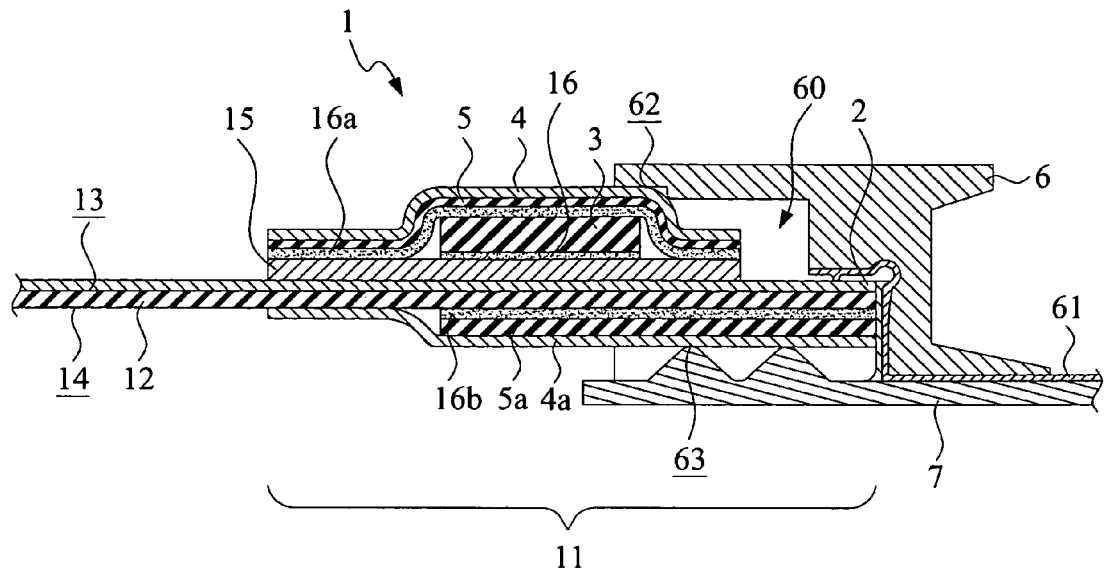
FIG. 6 is a cross-sectional view of the first embodiment of the present invention taken along line 6-6 of FIG. 5.

Referring to FIGS. 3-6, FIG. 3 shows a perspective view of a flexible-circuit-board cable in accordance with a first embodiment of the present invention and an electrical connector in an unconnected condition; FIG. 4 shows a top plan view of the flexible-circuit-board cable of the first embodiment of the present invention and the electrical connector in the unconnected condition; FIG. 5 shows a top plan view of the flexible-circuit-board cable of the first embodiment of the present invention connected to the electrical connector; and FIG. 6 shows a cross-sectional view of the first embodiment of the present invention taken along line 6-6 of FIG. 5. In the instant embodiment, an electrical connector 6 is mounted to a circuit board 7. When a flexible-circuit-board cable 1 having a positioning structure is inserted into an insertion space 60 defined in the connector 6, the plurality of conductive contacts 2 of the flexible-circuit-board cable 1 is precisely located to respectively engage conductive terminals 61 set inside the connector 6 to establish electrical connection therebetween for transmission of electrical signals. The shielding layers 4, 4a, and the projection section 3 of the connection zone 11 together define a first local zone A1 and a second local zone A2, which are put into contact with and thus positioned and retained by opposite walls 62, 63, 64, 65 on opposite sides of the insertion space 60 of the connector 6 so as to position and retain the flexible-circuit-board cable 1 having positioning structure according to the present invention within the connector 6.

Further, the shielding layers 4, 4a of the connection zone 11 effectively provide excellent shielding result by conducting external electromagnetic interference through an end of the flexible-circuit-board cable 1 to the proximal end circuit board.

Figure 7:
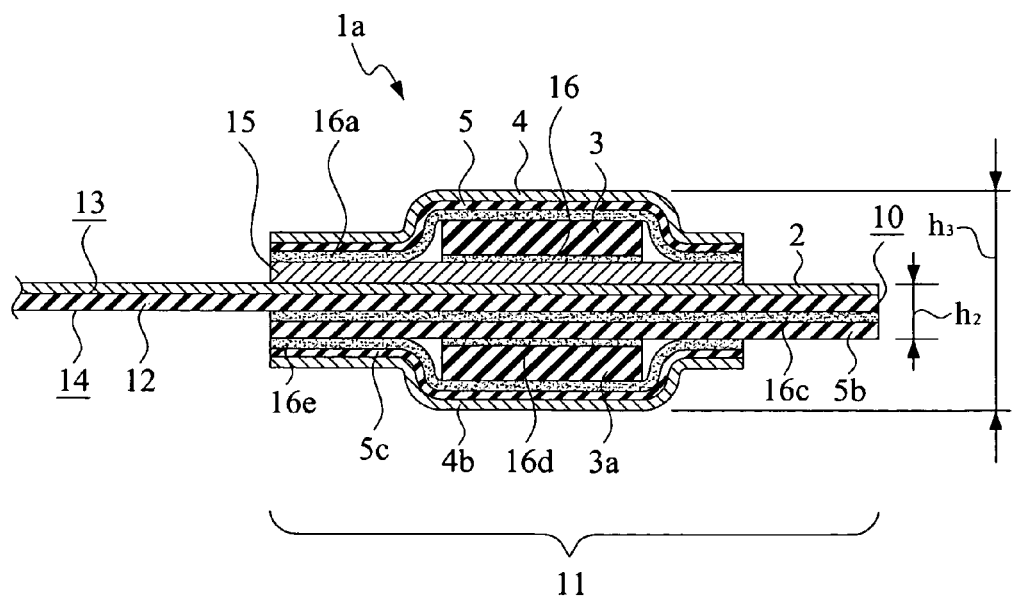
FIG. 7 is a cross-sectional view of a second embodiment in accordance with the present invention.

Referring to FIG. 7, which shows a cross-sectional view of a second embodiment in accordance with the present invention, in this embodiment, the flexible-circuit-board cable having a positioning structure in accordance with the present invention, which is designated at 1a for distinction, is composed of the same or similar constituent components as those of the first embodiment discussed previously, and the same components carry the same references for correspondence. The difference between the two embodiments resides in that, in the instant embodiment, the second surface 14 of the connection zone 11 is bonded to a substrate 5b with an adhesive layer 16c, and at least one projection section 3a is further bonded to an undersurface of the substrate 5b with an adhesive layer 16d, as illustrated in the drawing. The projection section 3a projects beyond a reference datum plane defined by the second surface 14 of the connection zone 11 by a predetermined height and extends along the reference datum plane in a direction to be adjacent to the connection zone 11, and is further bonded to a substrate 5c and a shielding layer 4b with an adhesive layer 16e, whereby the shielding layer 4b overlaps the projection section 3a and a portion of the second surface 14 of the connection zone 11 to construct the configuration illustrated in the drawing, wherein the conductive contacts 2 of the flexible-circuit-board cable 1a of the present invention provide a desired height h2 that allows for engagement with conductive terminals of an electrical connector and the flexible-circuit-board cable 1a also provides a height h3 that allows for retained engagement of the flexible-circuit-board cable 1a within the connector. Thus, the flexible-circuit-board cable 1a having a positioning structure in accordance with the instant embodiment of the present invention can be retained and positioned inside connectors of various forms.

Those having ordinary skills in the art may easily realize that the flexible-circuit-board cable of the present invention shows a technical feature of the positioning structure and it is apparent that any variation and modification that is made on the basis of the feature of the present invention is considered with the scope of the present invention. Thus, all the examples of flexible circuit board based flat cables, connectors, and circuit boards showing the structures and configurations discussed above are construed in such a way not to impose undesired limitation to the true scope of the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible-circuit-board cable, having a free end defining a connection zone and comprising a plurality of conductive contacts arranged in the connection zone, the flexible-circuit-board cable comprising a flexible circuit substrate, the connection zone being defined in the flexible circuit substrate and having a first surface and a second surface, an insulation layer being formed on the first surface of the flexible circuit substrate, at least one projection section being formed on the insulation layer of the first surface of the connection zone and the projection section being raised above a reference datum plane defined by the first surface of the connection zone by a predetermined height and extends on the reference datum plane in a direction toward a location adjacent to the conductive contacts of the connection zone, the second surface of the connection zone being bonded to a substrate and at least one projection section being formed on an undersurface of the substrate, the projection section projecting beyond a reference datum plane defined by the second surface of the connection zone by a predetermined height and extending along the reference datum plane in a direction to be adjacent to the connection zone; whereby when the connection zone of the flexible-circuit-board cable is inserted into an insertion space defined in a connector, at least a local zone defined by the projection section is put into engagement with and thus positioned and retained by opposite walls of the insertion space of the connector.

2. The flexible-circuit-board cable as claimed in claim 1 further comprising a shielding layer that overlaps the projection section and a portion of the first surface of the connection zone.

3. The flexible-circuit-board cable as claimed in claim 2, wherein the shielding layer is made of an electrically conductive material.

4. The flexible-circuit-board cable as claimed in claim 2, wherein the shielding layer has an undersurface forming a substrate that is bonded to a top surface of the projection section by an adhesive layer.

5. The flexible-circuit-board cable as claimed in claim 1, wherein the projection section is bonded to the insulation layer with an adhesive layer.

6. The flexible-circuit-board cable as claimed in claim 1, wherein the second surface of the connection zone is bonded to a substrate.

7. The flexible-circuit-board cable as claimed in claim 6 further comprising a shielding layer that overlaps an undersurface of the substrate and a portion of the second surface of the connection zone.

8. The flexible-circuit-board cable as claimed in claim 7, wherein the shielding layer is made of an electrically conductive material.

9. The flexible-circuit-board cable as claimed in claim 1 further comprising a shielding layer that overlaps the projection section and a portion of the second surface of the connection zone.

10. The flexible-circuit-board cable as claimed in claim 9, wherein the shielding layer is made of an electrically conductive material.

11. The flexible-circuit-board cable as claimed in claim 9, wherein the shielding layer has a top surface forming a substrate, which is bonded to an undersurface of the projection section by an adhesive layer.

12. The flexible-circuit-board cable as claimed in claim 1, wherein the projection section is bonded to the substrate with an adhesive layer.

* * * * *